United States Patent
Yoshii et al.

(10) Patent No.: US 10,749,496 B2
(45) Date of Patent: Aug. 18, 2020

(54) RESONATOR AND RESONANCE DEVICE

(71) Applicant: Murata Manufacturing Co., Ltd., Nagaokakyo-shi, Kyoto-fu (JP)

(72) Inventors: Kentaro Yoshii, Nagaokakyo (JP); Yuichi Goto, Nagaokakyo (JP); Keisuke Takeyama, Nagaokakyo (JP); Toshio Nishimura, Nagaokakyo (JP); Shungo Morinaga, Nagaokakyo (JP); Ryota Kawai, Nagaokakyo (JP); Yoshihisa Inoue, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 79 days.

(21) Appl. No.: 16/188,865

(22) Filed: Nov. 13, 2018

(65) Prior Publication Data

US 2019/0097600 A1 Mar. 28, 2019

Related U.S. Application Data

(63) Continuation of application No. PCT/JP2017/010605, filed on Mar. 16, 2017.

(30) Foreign Application Priority Data

Jun. 1, 2016 (JP) .................. 2016-110375

(51) Int. Cl.
*H03H 9/21* (2006.01)
*H03H 9/02* (2006.01)
(Continued)

(52) U.S. Cl.
CPC ...... *H03H 9/02141* (2013.01); *H03H 3/0077* (2013.01); *H03H 9/0595* (2013.01);
(Continued)

(58) Field of Classification Search
CPC .. B06B 1/0607; B06B 1/0603; H03H 9/1057; H03H 9/24; H03H 9/2489; H03H 9/2494;
(Continued)

(56) References Cited

U.S. PATENT DOCUMENTS 7,019,604 B2 3/2006 Gotoh et al.
8,304,968 B2 * 11/2012 Tanaya ................. H03H 9/0514
310/370

(Continued)

FOREIGN PATENT DOCUMENTS

JP 2003158442 A 5/2003
JP 2004112757 A 4/2004
(Continued)

OTHER PUBLICATIONS

International Search Report issued for PCT/JP2017/010605, dated Jun. 6, 2017.

(Continued)

*Primary Examiner* — J. San Martin
(74) *Attorney, Agent, or Firm* — Arent Fox LLP

(57) ABSTRACT

A resonator is provided having a first electrode and a second electrode; and a piezoelectric film that is disposed between the first and second electrodes, has an upper surface opposing the first electrode, and that vibrates in a predetermined vibration mode when a voltage is applied between the first and second electrodes. Moreover, the resonator includes a protective film made of an insulator and disposed opposing the upper surface of the piezoelectric film with the first electrode interposed therebetween. Furthermore, a conductive film made of a conductor is provided that is disposed opposing the upper surface of the piezoelectric film with the protective film interposed therebetween, where the conductive film is electrically connected to any one of the first and second electrodes.

20 Claims, 12 Drawing Sheets

(51) Int. Cl.
*H03H 9/10* (2006.01)
*H03H 3/007* (2006.01)
*H03H 9/24* (2006.01)
*H03H 9/05* (2006.01)
*H03H 9/15* (2006.01)

(52) U.S. Cl.
CPC ........ *H03H 9/1014* (2013.01); *H03H 9/1057* (2013.01); *H03H 9/21* (2013.01); *H03H 9/2489* (2013.01); *H03H 2009/155* (2013.01)

(58) Field of Classification Search
CPC .. H03H 9/2478; H03H 9/2484; H03H 9/2473; H03H 9/21; H03H 9/215; H03H 9/172; H03H 9/178; H03H 3/04; H03H 2003/026; H03H 2003/0492
See application file for complete search history.

(56) References Cited

U.S. PATENT DOCUMENTS

| | | | | |
|---|---|---|---|---|
| 8,479,364 B2 * | 7/2013 | Koizumi | ............. | H01L 41/0533 29/25.35 |
| 10,594,259 B2 * | 3/2020 | Kawashima | ........... | H03H 9/215 |
| 2002/0121944 A1 * | 9/2002 | Larson, III | ................ | H03H 3/04 333/187 |
| 2004/0017269 A1 | 1/2004 | Gotoh et al. | | |
| 2008/0061907 A1 * | 3/2008 | Lee | .......................... | H03H 3/02 333/188 |
| 2018/0175794 A1 * | 6/2018 | Yamazaki | ............... | H01L 41/09 |

FOREIGN PATENT DOCUMENTS

| | | | |
|---|---|---|---|
| JP | 3552013 B2 * | 8/2004 | |
| JP | 2008047982 A | 2/2008 | |
| JP | 2009077159 A | 4/2009 | |
| JP | 2009111623 A | 5/2009 | |
| JP | 2012065293 A | 3/2012 | |

OTHER PUBLICATIONS

Written Opinion of the International Searching Authority issued for PCT/JP2017/010605, dated Jun. 6, 2017.

* cited by examiner

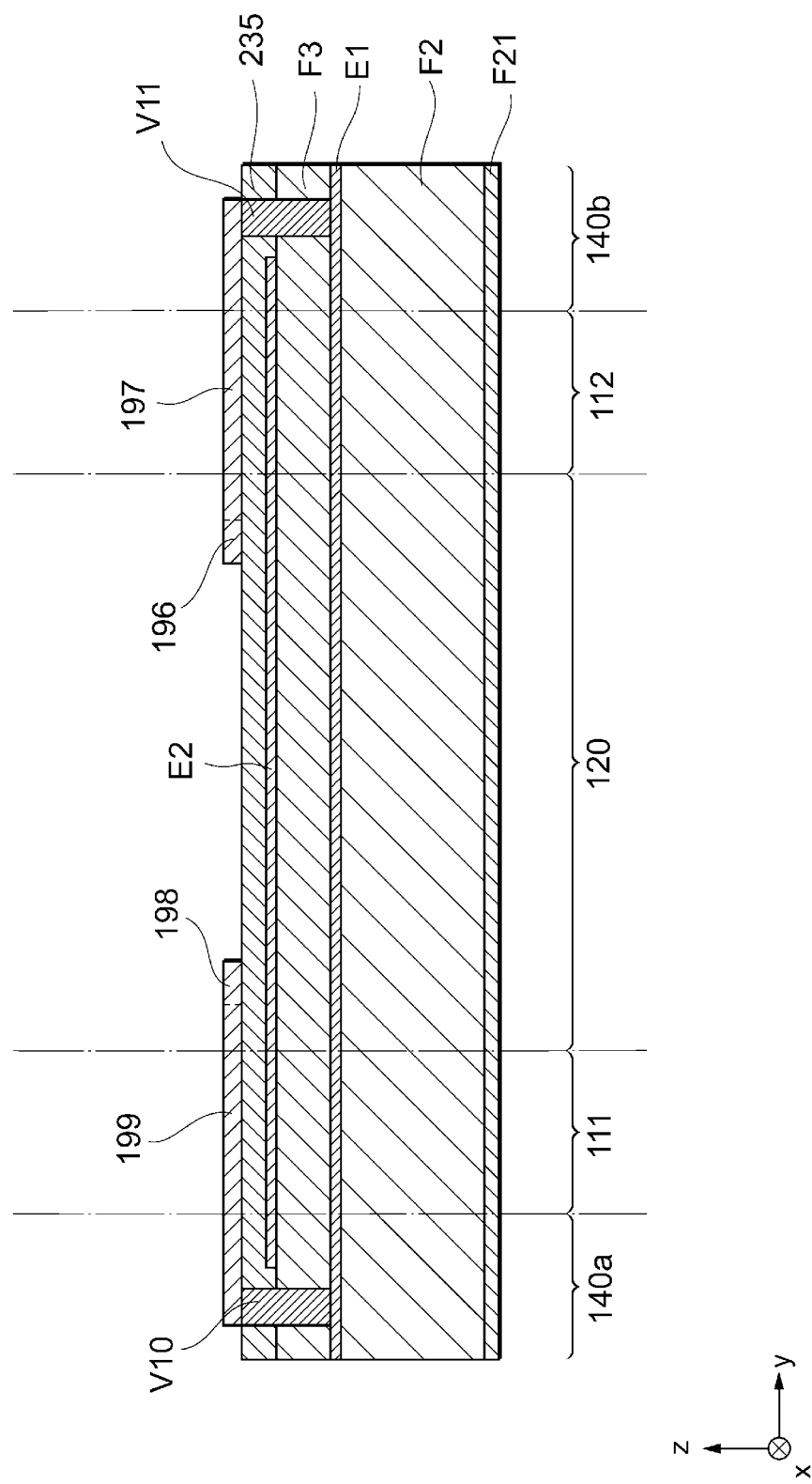

RESONATOR AND RESONANCE DEVICE

CROSS REFERENCE TO RELATED APPLICATIONS

The present application is a continuation of PCT/JP2017/010605 filed March 16, 2017, which claims priority to Japanese Patent Application No. 2016-110375, filed Jun. 1, 2016, the entire contents of each of which are incorporated herein by reference.

TECHNICAL FIELD

The present disclosure relates to resonators and resonance devices.

BACKGROUND

In general resonators, such as a piezoelectric vibrators, are used as a device for achieving a timer function in an electronic apparatus. With miniaturization of electronic apparatuses, a resonator is also required to be miniaturized, and a resonator manufactured using MEMS (Micro Electro Mechanical Systems) technology (hereinafter, also referred to as "MEMS vibrator") has attracted attention.

In the MEMS vibrator, variations in resonant frequency may occur due to manufacturing variations in some cases. Therefore, the frequency is adjusted by an additional etching or the like during or after the manufacturing of the MEMS vibrator.

For example, Patent Document 1 (identified below) discloses a configuration in which, in a vibrator having a plurality of vibration arms, a resonant frequency is adjusted by respectively reducing a mass portion for coarse adjustment provided at a tip end side of the vibration arm and a mass portion for fine adjustment provided at a base end side of the vibration arm.

Patent Document 1: Japanese Unexamined Patent Application Publication No. 2012-065293.

The mass portion described in Patent Document 1 includes an insulator layer and a conductive layer formed on the insulator layer. In the MEMS vibrator, in the case where such a mass portion is formed and the resonant frequency is adjusted using an ion beam, a pyroelectric material, or the like, the insulator layer may be charged. When the MEMS vibrator vibrates in a state in which the insulator layer on the MEMS vibrator is charged, Coulomb force is generated by the electric charge on the insulator layer so that the resonant frequency fluctuates.

SUMMARY OF THE INVENTION

The exemplary embodiments of the present disclosure have been contrived in view of the above circumstances, and it is an object of these exemplary embodiments to provide a resonator and resonance device that suppresses a situation in which an electric charge which is charged on an insulator layer on a resonator or a conductive layer on the insulator layer affects a resonant frequency.

Thus, in an exemplary aspect, a resonator is provided that includes a first electrode and a second electrode; and a piezoelectric film that is provided between the first electrode and the second electrode, has an upper surface opposing the first electrode, and vibrates in a predetermined vibration mode when a voltage is applied between the first electrode and the second electrode. Moreover, the resonator includes a protective film made of an insulator and provided opposing the upper surface of the piezoelectric film with the first electrode interposed therebetween; and a conductive film made of an conductor and provided opposing the upper surface of the piezoelectric film with the protective film interposed therebetween, wherein the conductive film is electrically connected to any one of the first electrode and the second electrode.

According to the exemplary aspects of the present disclosure, it is possible to suppress a situation in which the electric charge which is charged on the insulator layer on the resonator or the conductive layer on the insulator layer affects the resonant frequency.

BRIEF DESCRIPTION OF DRAWINGS

FIG. 12 is another cross-sectional view that is taken along the line D-D' in FIG. 10, and schematically illustrates a mode in which wiring is connected to a lower metal layer.

DETAILED DESCRIPTION OF EMBODIMENTS

First Exemplary Embodiment

Figure 1:
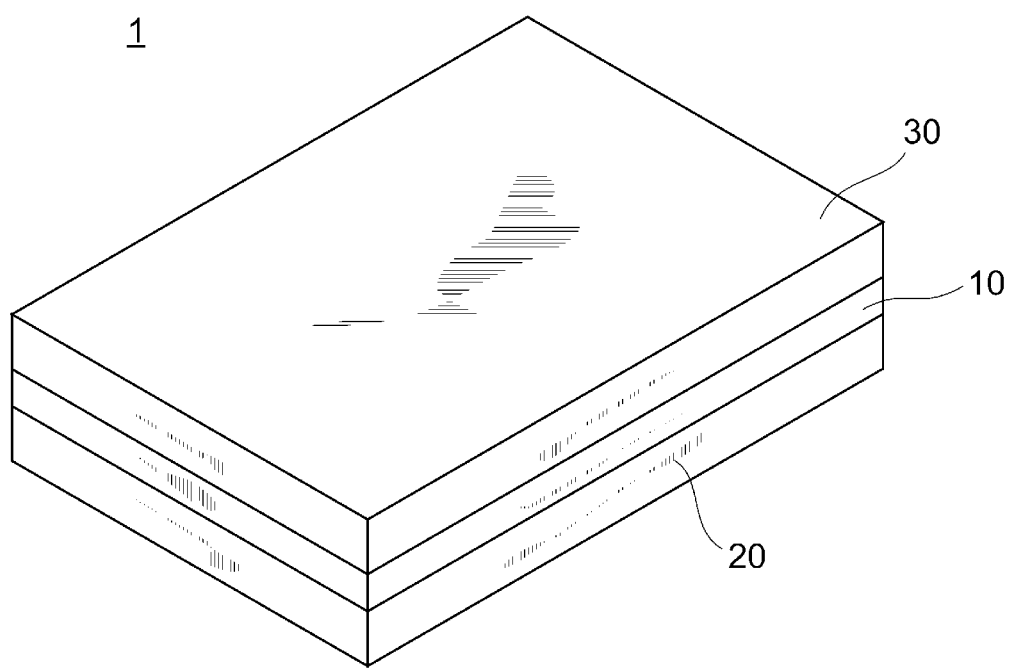
FIG. 1 is a perspective view schematically illustrating an external appearance of a resonance device according to a first exemplary embodiment.
Figure 2:
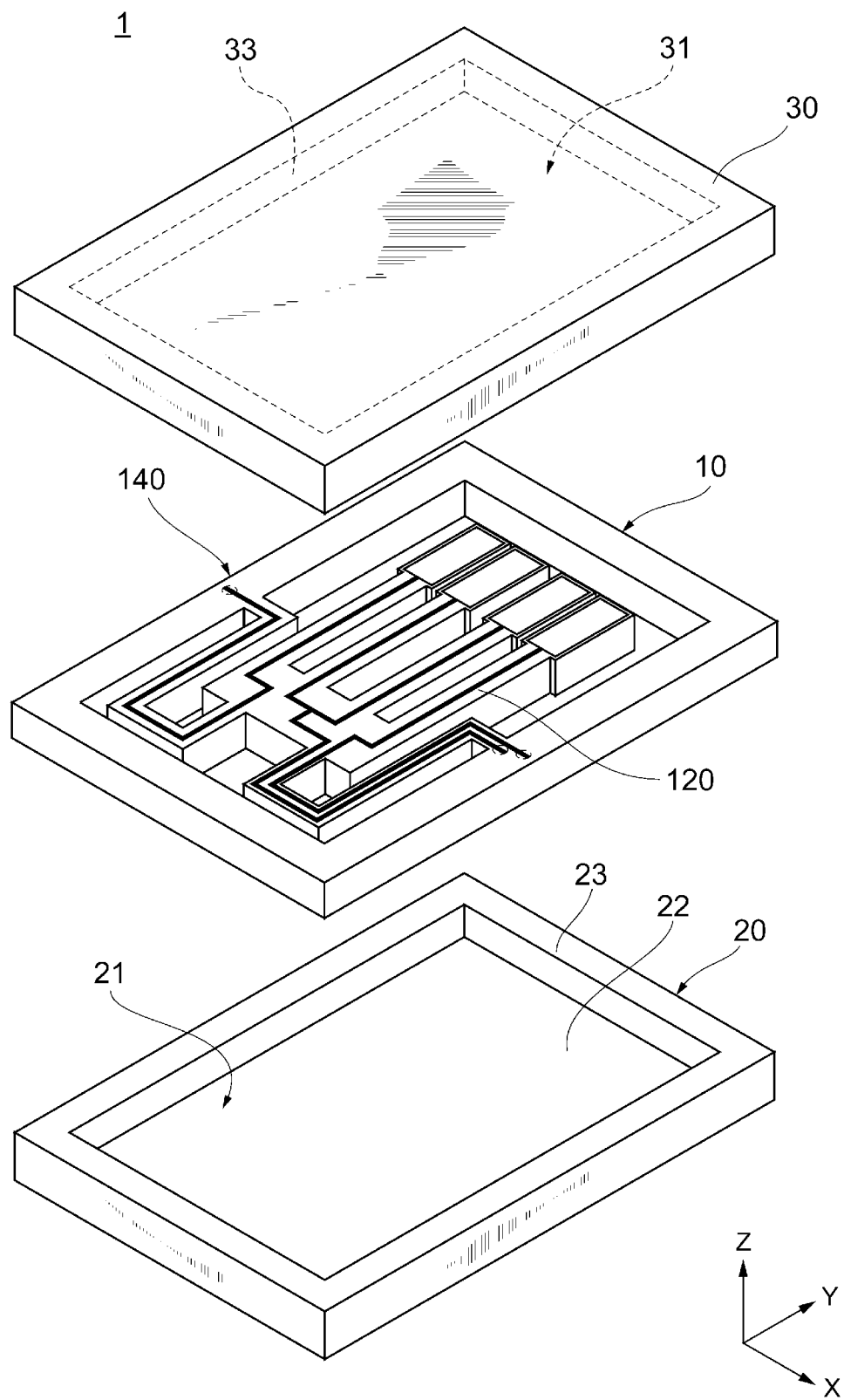
FIG. 2 is an exploded perspective view schematically illustrating a structure of the resonance device according to the first exemplary embodiment.

Hereinafter, a first exemplary embodiment will be described with reference to the accompanying drawings. FIG. 1 is a perspective view schematically illustrating an external appearance of a resonance device 1 according to the first embodiment. FIG. 2 is an exploded perspective view schematically illustrating a structure of the resonance device 1 according to the first embodiment.

As shown, the resonance device 1 includes a resonator 10, and an upper lid 30 and a lower lid 20 that are so provided as to oppose each other sandwiching the resonator 10. In other words, the resonance device 1 is constituted in such a manner that the lower lid 20, the resonator 10, and the upper lid 30 are laminated in that order.

Further, the resonator 10, the lower lid 20, and the upper lid 30 are bonded together, whereby the resonator 10 is sealed and a vibration space of the resonator 10 is formed. The resonator 10, the lower lid 20, and the upper lid 30 are each formed using a Si substrate. Then, the resonator 10, and the lower lid 20 and the upper lid 30 are bonded to each other by the Si substrates thereof being bonded to each other. The resonator 10 and the lower lid 20 may be formed using SOI substrates.

The resonator 10 is a MEMS resonator manufactured using MEMS technology. In this embodiment, a case in which the resonator 10 is formed using a silicon substrate will be exemplified and explained. Hereinafter, each configuration of the resonance device 1 will be described in detail.

Upper Lid 30

The upper lid 30 extends in a flat plate shape along an X-Y plane, and a recess 31 having, for example, a flat rectangular parallelepiped shape is formed on a rear surface thereof. The recess 31 is surrounded by a side wall 33, and forms part of the vibration space that is a space in which the resonator 10 vibrates.

Lower Lid 20

The lower lid 20 has a rectangular plate-shaped bottom plate 22 provided along the X-Y plane, and a side wall 23 extending from a peripheral edge of the bottom plate 22 in a Z-axis direction (i.e., in the lamination direction of the lower lid 20 and the resonator 10). On a surface of the lower lid 20 opposing the resonator 10, there is provided a recess 21 formed by a surface of the bottom plate 22 and an inner surface of the side wall 23. The recess 21 forms part of the vibration space of the resonator 10. With the above-described upper lid 30 and lower lid 20, this vibration space is hermetically sealed and a vacuum state is maintained. The vibration space may be filled with a gas such as an inert gas.

Resonator 10

Figure 3:
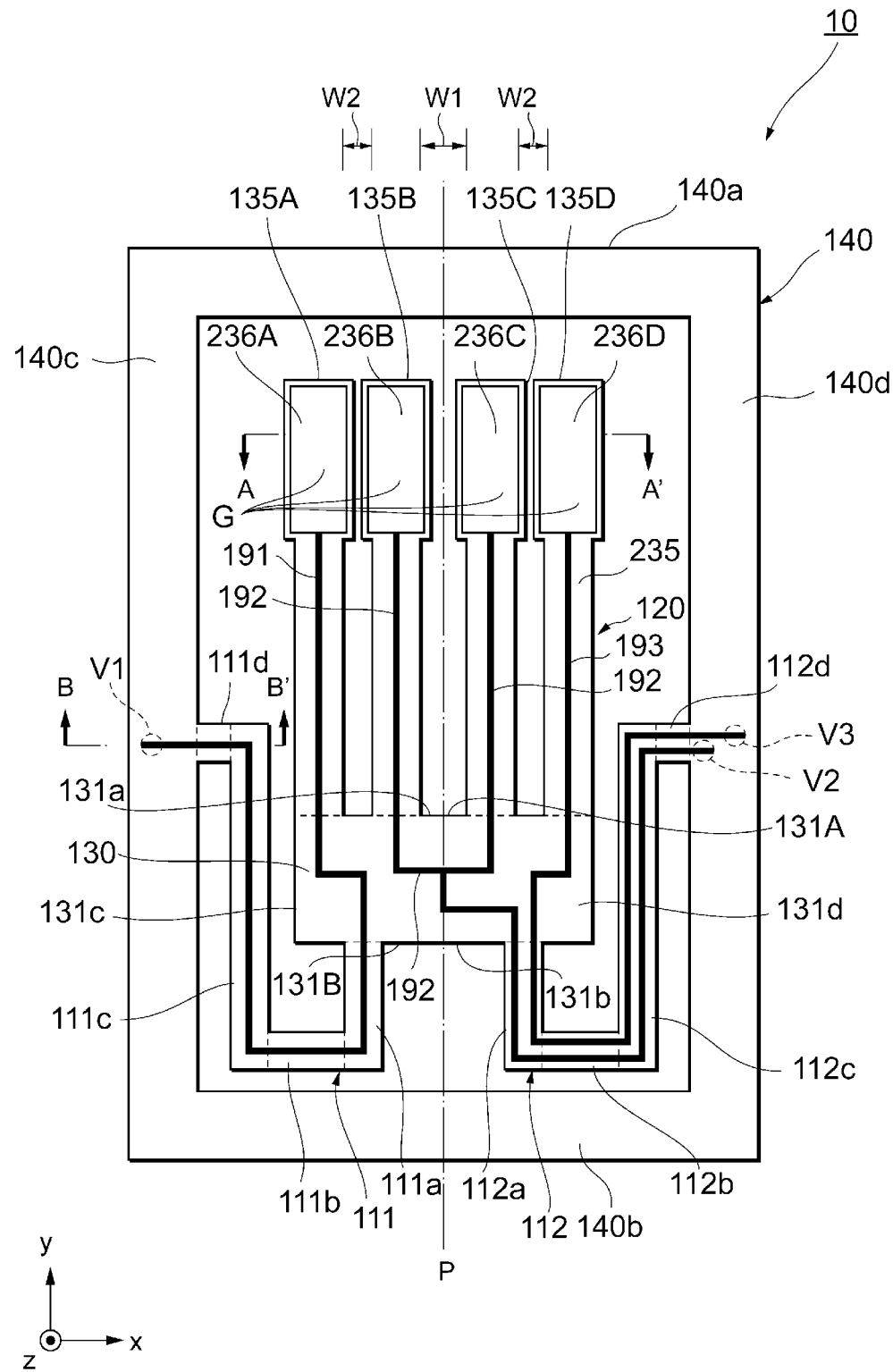
FIG. 3 is a plan view of a resonator according to the first exemplary embodiment, in which an upper-side substrate is removed.

FIG. 3 is a plan view schematically illustrating a structure of the resonator 10 according to the exemplary embodiment. Each configuration of the resonator 10 according to the present embodiment will be described with reference to FIG. 3. The resonator 10 includes a vibration section 120, a holding section 140, holding arms 111 and 112, wirings 191, 192 and 193, and vias V1, V2, and V3.

Vibration Section 120

The vibration section 120 (i.e., a vibrating component) has a rectangular contour extending along the X-Y plane in an orthogonal coordinate system in FIG. 3. The vibration section 120 is disposed inside the holding section 140, and a space is formed between the vibration section 120 and the holding section 140 at a predetermined interval. In the example of FIG. 3, the vibration section 120 includes a base 130 and four vibration arms 135A to 135D (also collectively referred to as "vibration arms 135"). It is noted that the number of vibration arms is not limited to four, and is set to an arbitrary number such as one or more than one. In this exemplary embodiment, each of the vibration arms 135 and the base 130 are integrally formed.

In a plan view, the base 130 has long sides 131a and 131b in an X-axis direction, and short sides 131c and 131d in a Y-axis direction. The long side 131a is one side of a front end surface 131A (hereinafter, also referred to as "front end 131A") of the base 130, and the long side 131b is one side of a rear end surface 131B (hereinafter, also referred to as "rear end 131B") of the base 130. In the base 130, the front end 131A and the rear end 131B are so disposed as to oppose each other.

At the front end 131A, the base 130 is connected to the vibration arms 135, which will be described later, and at the rear end 131B, the base 130 is connected to the holding arms 111 and 112, which will be described later. In addition, in the example of FIG. 3, the base 130 has a substantially rectangular shape in a plan view, but the shape is not limited thereto. Rather, it is sufficient that the base 130 is formed to be substantially plane-symmetric with respect to an imaginary plane P defined along a perpendicular bisector of the long side 131a. For example, the base 130 may have a trapezoidal shape in which the long side 131b is shorter than the long side 131a, or may have a semicircle shape taking the long side 131a as its diameter. Further, the long sides 131a and 131b and the short sides 131c and 131d are not limited to straight lines, and may be curved lines.

In the base 130, a base length (the length of the short sides 131c and 131d in FIG. 3), which is the longest distance between the front end 131A and the rear end 131B in a direction extending from the front end 131A toward the rear end 131B, is approximately 40 μm. In addition, a base width (the length of the long sides 131a and 131b in FIG. 3), which is the longest distance between side ends of the base 130 in a width direction orthogonal to the base length direction, is approximately 285 μm.

The vibration arms 135 extend in the Y-axis direction and have the same size. Each of the vibration arms 135 is provided between the base 130 and the holding section 140 in parallel with the Y-axis direction, and one end of the vibration arm 135 is a fixed end connected with the front end 131A of the base 130, while the other end thereof is an open end. Further, the vibration arms 135 are provided in parallel at predetermined intervals in the X-axis direction. Note that, for example, the vibration arm 135 has a width of about 50 μm in the X-axis direction and a length of about 420 μm in the Y-axis direction.

According to the exemplary aspect, each of the vibration arms 135 has a weight G at the open end thereof. The weight G has a larger width in the X-axis direction than the width of other portions of the vibration arm 135. For example, the weight G has a width of about 70 μm in the X-axis direction. The weight G is integrally formed with the vibration arm 135 in the same process. By forming the weight G, the weight per unit length of the vibration arm 135 is heavier on the open end side than on the fixed end side. Accordingly, since each of the vibration arms 135 has the weight G on the open end side thereof, the amplitude of vibrations in an up-down direction of each vibration arm can be increased.

In the vibration section 120 of the present embodiment, two vibration arms 135A and 135D are disposed in outer side portions and two vibration arms 135B and 135C are disposed in inner side portions in the X-axis direction. An interval W1 between the vibration arms 135B and 135C in the X-axis direction is set to be larger than an interval W2 between the vibration arm 135A (135D) in the outer side portion and the vibration arm 135B (135C) in the inner side portion adjacent to the vibration arm 135A (135D) in the outer side portion in the X-axis direction. The interval W1 is, for example, about 35 μm, and the interval W2 is, for example, about 25 μm. By setting the interval W2 smaller than the interval W1, vibration characteristics are improved. Further, in order to reduce the size of the resonance device 1, the interval W1 may be set smaller than the interval W2 or the intervals W1 and W2 may be set equal to each other.

Moreover, a protective film 235 is so formed on (i.e., disposed on) a surface of the vibration section 120 (a surface opposing the upper lid 30) as to cover the entire surface thereof. Further, on part of a surface of the protective film 235 in each of the vibration arms 135A to 135D, frequency adjusting films 236A to 236D (these are an example of a conductive film, and hereinafter, the frequency adjusting films 236A to 236D are also collectively referred to as "frequency adjusting films 236") are respectively formed. By using the protective film 235 and the frequency adjusting film 236, it is possible to adjust the resonant frequency of the vibration section 120. Although it is not absolutely necessary for the protective film 235 to cover the entire surface of the vibration section 120, it is desirable according to an exemplary aspect, that the entire surface of the vibration section 120 is covered in order to protect an underlying electrode film (e.g., a metal layer E2 in FIG. 4) and a piezoelectric film (e.g., a piezoelectric thin film F3 in FIG. 4) from being damaged during the frequency adjustment.

The frequency adjusting film 236 is formed (i.e., disposed) on the protective film 235 in such a manner that a surface of the frequency adjusting film 236 is exposed in at least part of a region where displacement due to the vibrations is relatively large compared with the other regions in the vibration section 120. Specifically, the frequency adjusting film 236 is formed at a tip end of the vibration arm 135, that is, formed on the weight G (an example of a second region). On the other hand, the surface of the protective film 235 is exposed in the other regions of the vibration arm 135 (an example of a first region). In this embodiment, the frequency adjusting film 236 is formed extending to the tip end of the vibration arm 135, and the protective film 235 is not exposed at all in the tip end portion; however, the frequency adjusting film 236 can also be configured not to be formed in the tip end portion of the vibration arm 135 in order that part of the protective film 235 is exposed.

(b) Holding Section 140

The holding section 140 (also referred to as a "frame") is formed in a rectangular frame shape along the X-Y plane. The holding section 140 is so provided as to surround an outer side portion of the vibration section 120 along the X-Y plane in a plan view. In an exemplary aspect, the holding section 140 is provided in at least part of the periphery of the vibration section 120, and is not limited to a continuous frame-like shape that entirely surrounds the vibrating section 120. For example, it is sufficient that the holding section 140 is provided around the vibration section 120 in such a manner as to hold the vibration section 120 and to be capable of being bonded with the upper lid 30 and the lower lid 20.

In this embodiment, the holding section 140 comprises prism-shaped frame bodies 140a to 140d that are integrally formed. As illustrated in FIG. 3, a longitudinal direction of the frame body 140a is disposed in parallel to the X-axis while opposing the open end of the vibration arm 135. A longitudinal direction of the frame body 140b is disposed in parallel to the X-axis while opposing the rear end 131B of the base 130. A longitudinal direction of the frame body 140c is disposed in parallel to the Y-axis while opposing a side end (short side 131c) of the base 130 and the vibration arm 135A, and the frame body 140c is connected to one end of each of the frame bodies 140a and 140b at both ends of the frame body 140c. A longitudinal direction of the frame body 140d is disposed in parallel to the Y-axis while opposing a side end (short side 131d) of the base 130 and the vibration arm 135D, and the frame body 140d is connected to the other end of each of the frame bodies 140a and 140b at both ends of the frame body 140d.

In this embodiment, the holding section 140 is described as being covered with the protective film 235. However, is it noted that the exemplary embodiments are not limited thereto, and the protective film 235 may not be formed on the surface of the holding section 140.

(c) Holding Arms 111, 112

The holding arm 111 and the holding arm 112 are provided inside the holding section 140, and connect the rear end 131B of the base 130 and the frame bodies 140c and 140d. As illustrated in FIG. 3, the holding arm 111 and the holding arm 112 are so formed as to be substantially plane-symmetric with respect to the imaginary plane P defined in parallel to a Y-Z plane along the center line in the X-axis direction of the base 130.

The holding arm 111 has arms (i.e., holding arm sections) 111a, 111b, 111c, and 111d. One end of the holding arm 111 is connected to the rear end 131B of the base 130, from which the holding arm 111 extends toward the frame body 140b. Then, the holding arm 111 bends in a direction toward the frame body 140c (that is, in the X-axis direction), bends in a direction toward the frame body 140a (that is, in the Y-axis direction), and bends in the direction toward the frame body 140c again (that is, in the X-axis direction); consequently, the other end of the holding arm 111 is connected to the frame body 140c.

The arm 111a is provided between the base 130 and the frame body 140b while opposing the frame body 140c in such a manner that a longitudinal direction thereof is parallel to the Y-axis. One end of the arm 111a is connected to the base 130 at the rear end 131B, from which the arm 111a extends in a direction substantially perpendicular to the rear end 131B, i.e., in the Y-axis direction. An axis passing through the center in the X-axis direction of the arm 111a is preferably provided inside the center line of the vibration arm 135A, and in the example of FIG. 3, the arm 111a is provided between the vibration arms 135A and 135B. Further, the other end of the arm 111a is connected, at a side surface thereof, to one end of the arm 111b. A width of the arm 111a defined in the X-axis direction is approximately 20 µm, and a length thereof defined in the Y-axis direction is 40 µm.

The arm 111b is provided between the base 130 and the frame body 140b while opposing the frame body 140b in such a manner that a longitudinal direction of the arm 111b is in parallel to the X-axis direction. The one end of the arm 111b is connected to the side surface of the arm 111a on a side opposing the frame body 140c, which is the other end of the arm 111a, and from which the arm 111b extends in a direction substantially perpendicular to the arm 111a, i.e., in the X-axis direction. Further, the other end of the arm 111b is connected to a side surface of the arm 111c on a side opposing the vibration section 120, which is one end of the arm 111c. The arm 111b has, for example, a width of about 20 µm defined in the Y-axis direction and a length of about 75 µm defined in the X-axis direction.

The arm 111c is provided between the base 130 and the frame body 140c while opposing the frame body 140c in such a manner that a longitudinal direction of the arm 111c is in parallel to the Y-axis direction. The one end of the arm 111c is connected, at its side surface, to the other end of the arm 111b, and the other end thereof is connected to a side surface of the arm 111d on the frame body 140c side, which is one end of the arm 111d. For example, the arm 111c has a width of about 20 µm defined in the X-axis direction and a length of about 140 µm defined in the Y-axis direction.

The arm 111d is provided between the base 130 and the frame body 140c while opposing the frame body 140a in such a manner that a longitudinal direction of the arm 111d is in parallel to the X-axis direction. The one end of the arm 111d is connected to the side surface of the arm 111c on a side opposing the frame body 140c, which is the other end of the arm 111c. Further, the other end of the arm 111d is connected to the frame body 140c at a position opposing the vicinity of a connecting point between the vibration arm 135A and the base 130, and the arm 111d extends therefrom in a direction substantially perpendicularly to the frame body 140c, that is, in the X-axis direction. For example, the arm 111d has a width of about 20 µm defined in the Y-axis direction and a length of about 10 µm defined in the X-axis direction.

As described above, the holding arm 111 is connected to the base 130 at the arm 111a, is bent at the connecting point between the arms 111a and 111b, the connecting point between the arms 111b and 111c, and the connecting point between the arms 111c and 111d, and then is connected to the holding section 140.

Similarly, the holding arm 112 has arms (i.e., holding arm sections) 112a, 112b, 112c, and 112d. One end of the holding arm 112 is connected to the rear end 131B of the base 130, from which the holding arm 112 extends toward the frame body 140b. Then, the holding arm 112 bends in a direction toward the frame body 140d (that is, in the X-axis direction), bends in a direction toward the frame body 140a (that is, in the Y-axis direction), and bends in the direction toward the frame body 140d again (that is, in the X-axis direction); consequently, the other end of the holding arm 112 is connected to the frame body 140d.

It is noted that the configurations of the arms 112a, 112b, 112c, and 112d are symmetrical with respect to the configurations of the arms 111a, 111b, 111c, and 111d, respectively, and therefore detailed description thereof will be omitted.

(d) Wiring 191, 192, 193

The wirings 191, 192, and 193 are formed on the protective film 235 exposed on the surface of the resonator 10. The wirings 191, 192, and 193 are wirings for connecting the frequency adjusting film 236 formed on the weight G of the vibration arm 135 to a metal layer E1 or E2 (see FIG. 4) to be described later.

The wiring 191 is formed extending from the vibration arm 135A to the base 130, the holding arm 111, and the frame body 140c. The wiring 191 is extracted from the frequency adjusting film 236A and is made to extend along the vibration arm 135A to the base 130, on the vibration arm 135A. The wiring 191 bends in a direction toward the frame body 140d at the base 130, extends along the rear end 131B to an extension point of the arm 111a of the holding arm 111, bends therefrom in a direction toward the frame body 140b, and extends toward the holding arm 111. Further, the wiring 191 is formed, on the holding arm 111, extending along the holding arm 111 to the frame body 140c, and is connected to the via V1 in the frame body 140c.

As shown, the wiring 192 is formed extending from the vibration arms 135B and 135C to the base 130, the holding arm 112, and the frame body 140d. The wiring 192 is formed in a two-branch shape in a partial region on the vibration section 120. One of the two branches of the wiring 192 is extracted from the frequency adjusting film 236B, extends, on the vibration arm 135B, along the vibration arm 135B to the base 130, bends in a direction toward the frame body 140d near the center of the base 130, and extends toward the other of the two branches. Further, the other of the two branches of the wiring 192 is extracted from the frequency adjusting film 236C, extends, on the vibration arm 135C, along the vibration arm 135C to the base 130, bends in a direction toward the frame body 140c near the center of the base 130, and extends toward the above one of the two branches. After the two branches of the wiring 192 are joined in the base 130, the wiring 192 bends in the direction toward the frame body 140b and bends again in the direction toward the frame body 140d; thereafter, the wiring 192 extends along the rear end 131B to an extension point of the arm 112a of the holding arm 112, bends in the direction toward the frame body 140b further, and extends toward the holding arm 112. The wiring 192 is formed, on the holding arm 112, extending along the holding arm 112 to the frame 140d, and is connected to the via V2 in the frame body 140d.

The wiring 193 is formed extending from the vibration arm 135D to the base 130, the holding arm 112, and the frame body 140d. The wiring 193 is extracted from the frequency adjusting film 236D and is made to extend along the vibration arm 135D to the base 130, on the vibration arm 135D. The wiring 193 bends in the direction toward the frame body 140d at the base 130, extends along the rear end 131B to an extension point of the arm 112a of the holding arm 112, bends therefrom in the direction toward the frame body 140b, and extends toward the holding arm 112. Further, the wiring 193 is formed, on the holding arm 112, extending along the wiring 192 to the frame body 140d, and is connected to the via V3 in the frame body 140d.

(e) Vias V1, V2, V3

Figure 4:
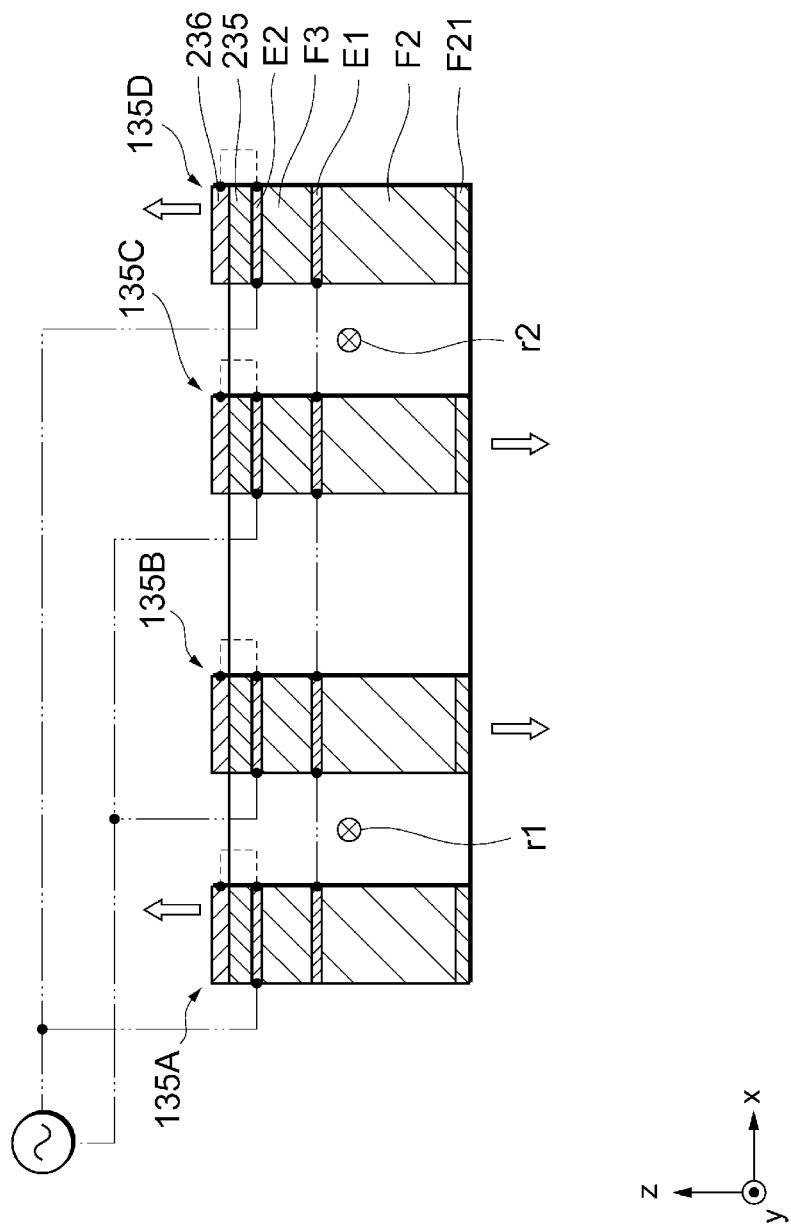
FIG. 4 is a cross-sectional view taken along a line A-A' in FIG. 3.

The vias V1, V2, and V3 are holes formed on the holding section 140 and filled with metal, for electrically connecting the frequency adjusting film 236 to the metal layer E1 or E2 (see FIG. 4) to be described later via the wirings 191, 192, and 193. It is noted that FIG. 4 illustrates an example in which the frequency adjusting film 236 and the metal layer E2 are connected to each other. In FIG. 4, broken lines indicate electrical connections, and dotted lines indicate electrical connections, particularly connections by the vias V1, V2, and V3.

More specifically, the via V1 is formed in the frame body 140c in the vicinity of the connecting point with the holding arm 111, and connects the wiring 191 and the metal layer E1 or E2 (see FIG. 4) to be described later. The vias V2 and V3 are formed in the frame body 140d in the vicinity of the connecting point with the holding arm 112. The vias V2 and V3 connect the metal layer E1 or E2 (see FIG. 4) to be described later, and the wirings 192 and 193, respectively.

Laminated Structure

A laminated structure of the resonator 10 will be described with reference to FIG. 4. FIG. 4 is a general view schematically illustrating a cross section taken along a line A-A' in FIG. 3, and an electrical connection mode of the resonator 10.

In the resonator 10, the holding section 140, the base 130, the vibration arm 135, and the holding arms 111, 112 are integrally formed in the same process. In the resonator 10, first, the metal layer E1 (an example of a second electrode) is laminated on a Si (silicon) substrate F2. Then, the piezoelectric thin film F3 (an example of a piezoelectric film) is so laminated on the metal layer E1 as to cover the metal layer E1; further, on a surface of the piezoelectric thin film F3 (an example of an upper surface), the metal layer E2 (an example of a first electrode) is laminated. The protective film 235 is so laminated on the metal layer E2 as to cover the metal layer E2. On the vibration section 120, the frequency adjusting film 236 is further laminated on the protective film 235. Note that, by using a degenerate silicon substrate having low resistance, it is also possible to omit the metal layer E1 since the Si substrate F2 itself serves as the metal layer E1.

The Si substrate F2 is formed of, for example, a degenerated n-type Si semiconductor having a thickness of about 6 µm, and may include P (phosphorus), As (arsenic), Sb (antimony), or the like as an n-type dopant. In particular, it is preferable that a rotation angle formed by a [100] crystal axis of the Si substrate F2 made of the vibration arm 135 and the n-type Si semiconductor or a crystal axis equivalent thereto fall within a range of greater than 0 degrees and equal to or smaller than 15 degrees (or equal to or greater than 0 degrees and equal to or smaller than 15 degrees), or equal to or greater than 75 degrees and equal to or smaller than 90 degrees. Here, the rotation angle refers to an angle of a direction in which the holding arm 110 extends with respect to a line segment along the [100] crystal axis of the Si substrate F2 or a crystal axis equivalent thereto.

Further, the resistance value of the degenerate Si used for the Si substrate F2 is, for example, less than 1.6 mΩ·cm, and more preferably, equal to or less than 1.2 mΩ·cm. Further, a silicon oxide (e.g., $SiO_2$) layer (temperature characteristics correction layer) F21 is formed on a lower surface of the Si substrate F2. With this, temperature characteristics can be improved.

In this embodiment, the silicon oxide layer (temperature characteristics correction layer) F21 refers to a layer having a function of reducing a frequency temperature coefficient (i.e., a change rate per temperature) at the vibration section at least near in a room temperature in a case where the temperature correction layer is formed on the Si substrate F2, in comparison with a case where the silicon oxide layer F21 is not formed on the Si substrate F2. Since the vibration section 120 has the silicon oxide layer F21, it is possible to reduce a change in the resonant frequency, with respect to the temperature, of the laminated structure including the Si substrate F2, the metal layers E1 and E2, the piezoelectric thin film F3, and the silicon oxide layer (temperature correction layer) F21, for example.

In the resonator 10, the silicon oxide layer F21 is preferably formed with a uniform thickness. It is noted that for purposes of this disclosure, the uniform thickness means that a variation in thickness of the silicon oxide layer F21 falls within a range of ±20% of the average thickness value.

It is further note that the silicon oxide layer F21 may be formed on the upper surface of the Si substrate F2 or on both the upper surface and the lower surface of the Si substrate F2. In addition, in the holding section 140, the silicon oxide layer F21 may not be formed on the lower surface of the Si substrate F2.

The metal layers E2 and E1 are each formed using, for example, Mo (molybdenum), aluminum (Al), or the like having a thickness of about 0.1 to 0.2 μm. The metal layers E2 and E1 are each formed into a desired shape by etching or the like. The metal layer E1 is so formed as to function as a lower electrode on the vibration section 120, for example. Further, the metal layer E1 is so formed as to function as a wiring for connecting the lower electrode to an AC power supply provided at the outside of the resonator 10, on the holding arms 111 and 112, the holding section 140, and the like.

On the other hand, the metal layer E2 is so formed as to function as an upper electrode on the vibration section 120. Further, the metal layer E2 is so formed as to function as a wiring for connecting the upper electrode to a circuit provided at the outside of the resonator 10, on the holding arms 111 and 112, the holding section 140, and the like.

In the case where the AC power supply is electrically connected to the lower wiring or the upper wiring, a configuration in which an electrode (an example of an outer electrode) is formed on an outer surface of the upper lid 30 so that the stated electrode connects the circuit and the lower wiring or the upper wiring, a configuration in which a via is formed in the upper lid 30, the interior of the via is filled with a conductive material to provide a wiring, and the stated wiring connects the AC power supply and the lower wiring or the upper wiring, or the like may be employed.

According to the exemplary aspect, the piezoelectric thin film F3 is a thin film of piezoelectric material configured to convert an applied voltage into vibrations, and may contain, as main ingredients, nitride such as AlN (aluminum nitride), oxide, and the like. Specifically, the piezoelectric thin film F3 can be formed of ScAlN (scandium aluminum nitride). In ScAlN, part of aluminum in aluminum nitride is replaced with scandium. Further, although the piezoelectric thin film F3 has a thickness of, for example, 1 μm, it is also possible to employ a thickness of about 0.2 μm to 2 μm.

The piezoelectric thin film F3 expands and contracts in an in-plane direction of the X-Y plane, i.e., in the Y-axis direction, in accordance with an electric field applied to the piezoelectric thin film F3 by the metal layers E2 and E1. Due to the expansion and contraction of the piezoelectric thin film F3, the vibration arm 135 displaces its open end toward the inner surfaces of the lower lid 20 and the upper lid 30, and vibrates in an out-of-plane bending vibration mode. In addition, in this embodiment, in the out-of-plane bending vibration mode of the four arms, although two inner arms and two outer arms are configured to perform bending vibration in opposite directions to each other, the exemplary embodiments are not limited thereto. For example, an alternative configuration including a single vibration arm, a configuration in which the vibration is performed in an in-plane bending vibration mode, or the like may be employed.

The protective film 235 is a layer of an insulator, and is formed of a material whose mass reduction rate due to etching is slower than that of the frequency adjusting film 236. For example, the protective film 235 is formed of a nitride film such as AlN or SiN, or an oxide film such as $Ta_2O_5$ (tantalum pentoxide) or $SiO_2$. Note that the mass reduction rate is expressed by the product of the etching rate (thickness removed per unit time) and the density. The thickness of the protective film 235 is equal to or less than half of the thickness (C-axis direction) of the piezoelectric thin film F3, and is, for example, about 0.2 μm in this embodiment. It is noted that a more preferable thickness of the protective film 235 is about a quarter of the thickness of the piezoelectric thin film F3. Further, in a case where the protective film 235 is formed of a piezoelectric material such as AlN, it is preferable to use a piezoelectric material having the same orientation as that of the piezoelectric thin film F3.

The frequency adjusting film 236 is a layer of a conductor, and is formed of a material whose mass reduction rate due to etching is faster than that of the protective film 235. The frequency adjusting film 236 is formed of, for example, a metal such as molybdenum (Mo), tungsten (W), gold (Au), platinum (Pt), nickel (Ni), aluminum (Al), titanium (Ti) or the like.

In the case where the relationship between the mass reduction rates of the protective film 235 and the frequency adjusting film 236 is the one as described above, the magnitude relationship of the etching rate is arbitrary.

The frequency adjusting film 236 is formed substantially on the entire surface of the vibration section 120, and then is formed only in a predetermined region by processing such as etching.

Etching of the protective film 235 and the frequency adjusting film 236 is performed by, for example, irradiating the protective film 235 and the frequency adjusting film 236 with an ion beam (e.g., an argon (Ar) ion beam) at the same time. The ion beam can be radiated onto a range wider than the resonator 10. Although an example in which etching is performed using an ion beam is described in this embodiment, the etching method is not limited to the ion beam.

Function of Resonator

Referring to FIG. 4, the function of the resonator 10 will be described. In this embodiment, the phase of the electric field applied to the vibration arms 135A and 135D in the outer side portions and the phase of the electric field applied to the vibration arms 135B and 135C in the inner side portions are set to be opposite to each other. Thus, the vibration arms 135A and 135D in the outer side portions and the vibration arms 135B and 135C in the inner side portions are displaced in opposite directions to each other. For example, when the vibration arms 135A and 135D in the outer side portions displace their open ends toward the inner surface of the upper lid 30, the vibration arms 135B and 135C in the inner side portions displace their open ends toward the inner surface of the lower lid 20.

As a result, in the resonator 10 according to the present embodiment, in the case of antiphase vibration, the vibration arm 135A and the vibration arm 135B vibrate in opposite directions, that is, in an upward direction and a downward direction relative to a center axis r1 extending in parallel to the Y-axis between the vibration arm 135A and the vibration arm 135B as illustrated in FIG. 4. Further, the vibration arm 135C and the vibration arm 135D vibrate in opposite directions, that is, in the downward direction and the upward direction relative to a center axis r2 extending in parallel to the Y-axis between the vibration arm 135C and the vibration arm 135D. As a result, torsional moments in opposite directions to each other are generated with respect to the center axes r1 and r2, and bending vibrations occur in the base 130.

Function of Frequency Adjusting Film

Next, the function of the frequency adjusting film 236 will be described. In the resonance device 1 according to the present embodiment, after the above-discussed resonator 10 is formed, a trimming process of adjusting the film thickness of the frequency adjusting film 236 is carried out.

In the trimming process, first, the resonant frequency of the resonator 10 is measured, and a deviation with respect to the target frequency is calculated. Next, the film thickness of the frequency adjusting film 236 is adjusted based on the calculated frequency deviation. The adjustment of the film thickness of the frequency adjusting film 236 can be performed by, for example, radiating an argon (Ar) ion beam onto the entire surface of the resonance device 1 and etching the frequency adjusting film 236. Further, when the film thickness of the frequency adjusting film 236 has been adjusted, it is desirable to clean the resonator 10 and remove the scattered film.

By adjusting the thickness of the frequency adjusting film 236 through the trimming process as discussed above, it is possible to suppress the variation in frequency among a plurality of resonance devices 1 produced on the same wafer.

Connection Mode

Figure 5:
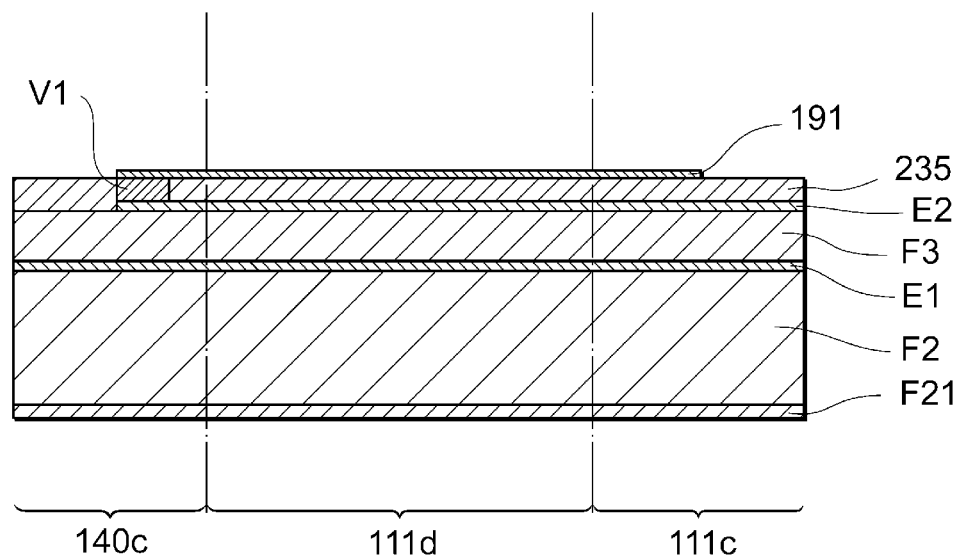
FIG. 5 is a cross-sectional view that is taken along a line B-B' in FIG. 3, and schematically illustrates a mode in which wiring is connected to an upper metal layer.
Figure 5:
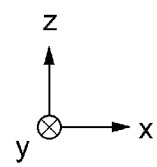
Figure 6:
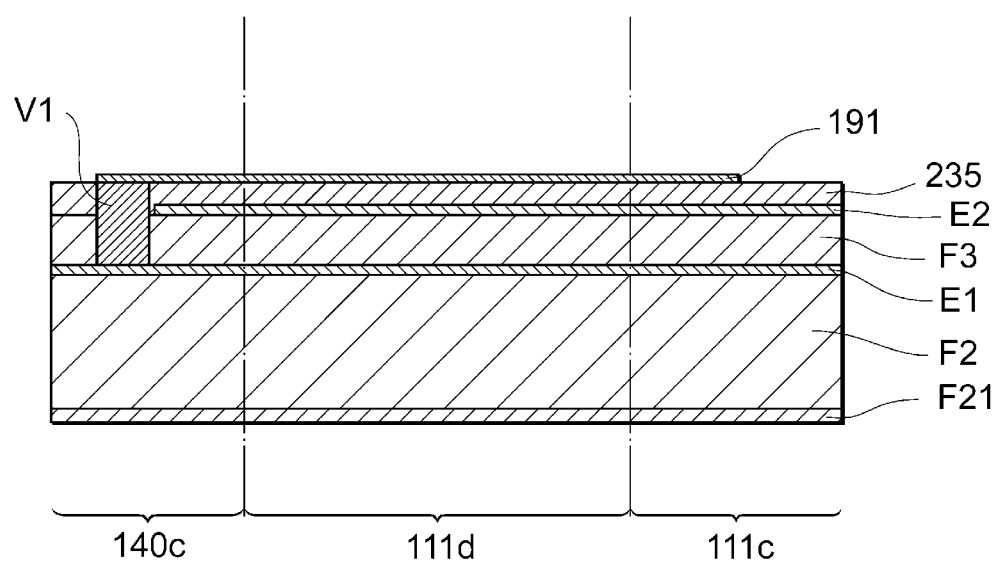
FIG. 6 is another cross-sectional view that is taken along the line B-B' in FIG. 3, and schematically illustrates a mode in which wiring is connected to a lower metal layer.

With reference to FIGS. 5 and 6, a connection mode of the frequency adjusting film 236 and the metal layers E2 and E1 in the resonator 10 according to the present embodiment will be described while taking a connection mode of the wiring 191 and the metal layers E2 and E1 as an example. Each of FIGS. 5 and 6 is a general view schematically illustrating a cross section taken along a line B-B' in FIG. 3. FIG. 5 illustrates a case where the wiring 191 is connected to the metal layer E2, and FIG. 6 illustrates a case where the wiring 191 is connected to the metal layer E1.

As illustrated in FIG. 5, when the wiring 191 is connected to the metal layer E2, the via V1 is formed in the following manner: a hole is formed by removing part of the protective film 235 so that the surface of the metal layer E2 is exposed, and then the hole is filled with a conductor. The conductor to fill the via V1 is, for example, Mo (molybdenum), aluminum (Al), or the like.

The wiring 191 is formed on the surface of the protective film 235 extending from the holding arm 111 to a position where the via V1 in the frame body 140c is formed, and is connected to the metal layer E2 via the via V1. The wiring 191 is formed of, for example, Mo (molybdenum), aluminum (Al), or the like.

Further, as illustrated in FIG. 6, in the case where the wiring 191 is connected to the metal layer E1, the via V1 is formed in the following manner: a hole is formed by removing part of the protective film 235 and piezoelectric thin film F3 so that the surface of the metal layer E1 is exposed, and then the hole is filled with a conductor. The wiring 191 is formed on the surface of the protective film 235 extending from the holding arm 111 to a position where the via V1 in the frame body 140c is formed, and is connected to the metal layer E1 via the via V1.

Effects of electrically connecting the frequency adjusting film 236 to the metal layers E1 and E2 will be described below. In the above-described trimming process, when the resonator 10 is irradiated with the ion beam, the protective film 235 is also irradiated with the ion beam, whereby the protective film 235 is charged by the electric charge included in the ion beam. In addition, in a case where a pyroelectric material is used for the protective film 235, a pyroelectric effect is generated by the temperature rise and fall of heat, whereby an electric charge appears on the interface of the protective film 235.

In the resonator 10 according to the present embodiment, the frequency adjusting film 236 made of a conductor and formed on part of the protective film 235 is connected to the metal layers E2 and E1 via the wiring 191 and the via V1. Thus, the electric charge which is charged on the protective film 235 can be transferred to the metal layers E2 and E1. The electric charge having been transferred to the metal layers E2 and E1 can be released to the exterior of the resonance device 1 through external connection terminals connected to the metal layers E2 and E1. As discussed above, in the resonator 10 according to the present embodiment, since it is possible to suppress an electric charge which is charged on the protective film 235 formed on the vibration section 120, it is possible to prevent the resonant frequency variation due to the electric charge on the vibration section 120.

Further, in the case where the frequency adjusting film 236 is connected to the metal layer E2, the conductive layer (frequency adjusting film 236) formed on the protective film 235 can be connected to a layer close to the protective film 235. Thus, it is possible to further reduce the influence of the electric charge which is charged on the protective film 235 on the resonant frequency. In the case where the frequency adjusting film 236 is connected to the metal layer E2, and a piezoelectric material such as AlN is used for the protective film 235, it is preferable to use a material having the same orientation as that of the piezoelectric thin film F3. Thus, the frequency adjusting film 236 can be connected to the metal layer E2 without obstructing the vibrations of the vibration arm 135.

Since a connection mode, materials, effects, and the like of the vias V2 and V3 and the wirings 192 and 193 are the same as those of the via V1 and the wiring 191, description thereof will be omitted herein.

Second Exemplary Embodiment

In a second exemplary embodiment and the embodiments following the second embodiment, description of the same constituent elements as those of the first embodiment will be omitted and only different points therefrom will be explained. In particular, similar operational effects brought by the same configuration will not be referred to in each embodiment.

Figure 7:
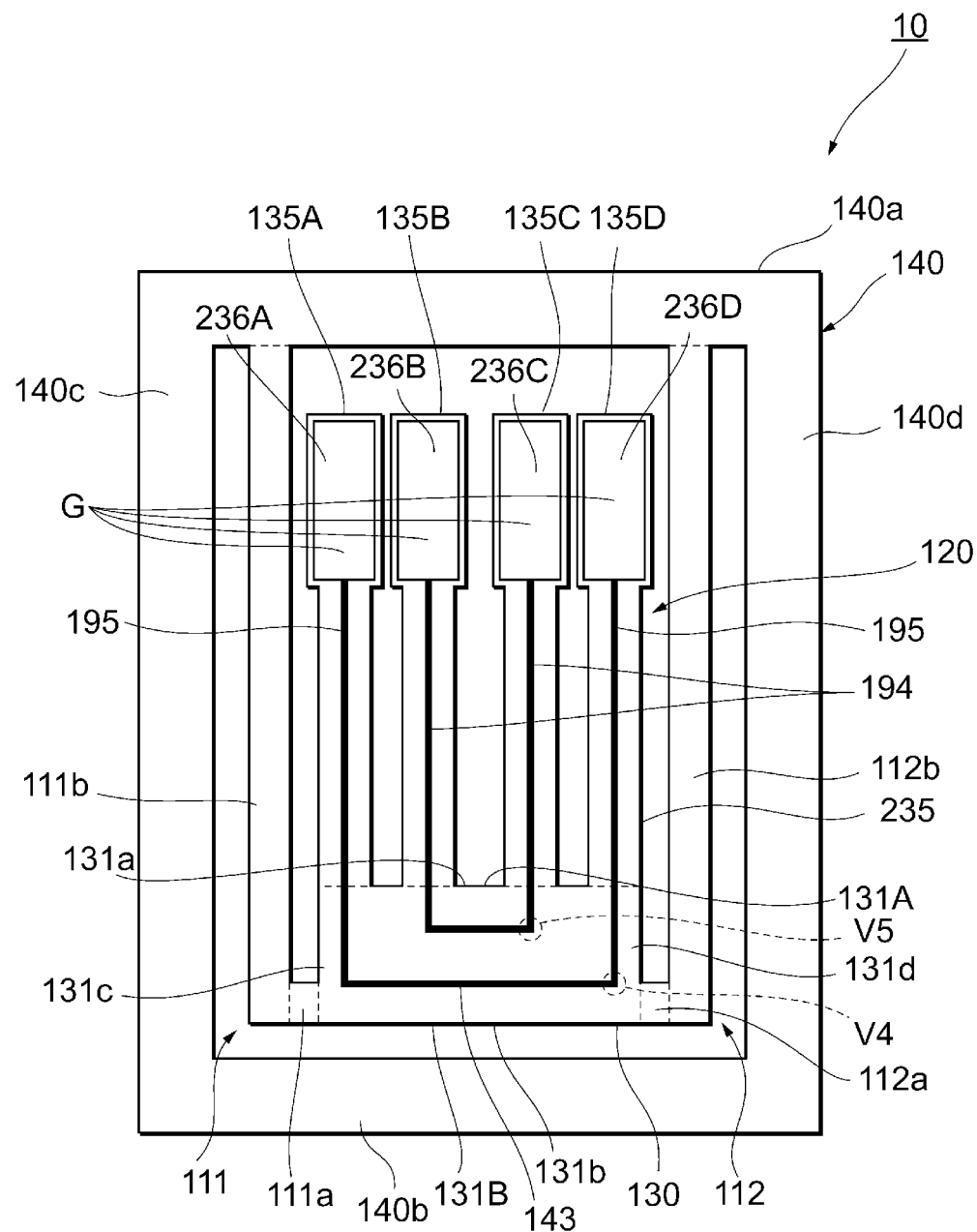
FIG. 7 is a plan view of a resonator according to a second exemplary embodiment.

FIG. 7 is a plan view schematically illustrating an example of the structure of a resonator 10 according to the present embodiment. Hereinafter, among the detailed configurations of the resonator 10 according to the present embodiment, different points from the first embodiment will be mainly described. The resonator 10 according to the present embodiment includes wirings 194 and 195 and vias V4 and V5 in place of the wirings 191, 192, and 193 and the vias V1, V2, and V3 described in the first embodiment. Further, holding arms 111 and 112 according to the present embodiment have different structures from those of the first embodiment.

Holding Arms 111, 112

In this embodiment, the holding arm 111 has arms 111a and 111b. One end of the holding arm 111 is connected to a side surface of a base 130 on the side of a short side 131c, from which the holding arm 111 extends toward a frame body 140c. Then, the holding arm 111 is bent in a direction toward a frame body 140a (Y-axis direction), and the other end thereof is connected to the frame body 140a.

Specifically, in this embodiment, the arm 111a is provided between the base 130 and the frame body 140c while opposing the frame body 140a in such a manner that the longitudinal direction of the arm 111a is in parallel to the X-axis direction. One end of the arm 111a is connected, at its end surface, to the side surface of the base 130 on the side of the short side 131c. Further, the other end of the arm 111a is connected, at its side surface, to the arm 111b. The arm 111a has a width of about 20 μm defined in the Y-axis direction, and a length of about 40 μm defined in the X-axis direction.

Further, the arm 111b is provided between the base 130 and the frame body 140c while opposing the frame body 140c in such a manner that the longitudinal direction of the arm 111b is in parallel to the Y-axis direction. One end of the arm 111b is connected to the side surface of the arm 111a on the side opposing the frame body 140a, which is the other end of the arm 111a, and from which the arm 111b extends in a direction substantially perpendicularly to the arm 111a, i.e., in the Y-axis direction. Further, the other end of the arm 111b is connected to the frame body 140a. The arm 111b has, for example, a width of about 20 μm defined in the X-axis direction, and a length of about 620 μm defined in the Y-axis direction.

In this exemplary embodiment, the holding arm 112 has arms 112a and 112b. One end of the holding arm 112 is connected to a side end of the base 130 on the side of a short side 131c, from which the holding arm 112 extends toward a frame body 140d. Then, the holding arm 112 is bent in the direction toward the frame body 140a (Y-axis direction), and the other end thereof is connected to the frame body 140a.

It is noted that the configurations of the arms 112a and 112b are symmetrical with respect to the configurations of the arms 111a and 111b, respectively, and therefore detailed description thereof will be omitted. Other configurations of the holding arms 111 and 112 are the same as those in the first embodiment.

(2) Wiring 194, 195

The wiring 194 is formed extending from vibration arms 135B and 135C to the base 130. The wiring 194 is formed in a two-branch shape in a partial region on a vibration section 120. One of the two branches of the wiring 194 is extracted from a frequency adjusting film 236B, extends, on the vibration arm 135B, along the vibration arm 135B to the base 130, bends in the direction toward the frame body 140d near the center of the base 130, and extends toward the other of the two branches. Further, the other of the two branches of the wiring 194 is extracted from a frequency adjusting film 236C, extends, on the vibration arm 135C, along the vibration arm 135C to the base 130, bends in the direction toward the frame body 140c near the center of the base 130, and extends toward the above one of the two branches. The two branches of the wiring 194 are joined in the base 130.

The wiring 195 is formed extending from vibration arms 135A and 135D to the base 130. The wiring 195 is formed in a two-branch shape in a partial region on the vibration section 120. One of the two branches of the wiring 195 is extracted from a frequency adjusting film 236A, extends, on the vibration arm 135A, along the vibration arm 135A to the base 130, bends in the direction toward the frame body 140d near the center of the base 130, and extends toward the other of the two branches. Further, the other of the two branches of the wiring 195 is extracted from a frequency adjusting film 236D, extends, on the vibration arm 135D, along the vibration arm 135D to the base 130, bends in the direction toward the frame body 140c near the center of the base 130, and extends toward the above one of the two branches. The two branches of the wiring 195 are joined in the base 130.

(3) Vias V4, V5

In this embodiment, the vias V4 and V5 are formed on the base 130, and electrically connect a frequency adjusting film 236 to a metal layer E1 or E2 via the wirings 194 and 195.

More specifically, the via V4 is formed in a position corresponding to a bending portion of the wiring 194 near a connecting point with the holding arm 112 in the base 130, and connects the wiring 194 to the metal layer E1 or E2 (see FIG. 4). The via V5 is formed in a position corresponding to the bending portion of the wiring 194 near a connecting point with the vibration arm 135D in the base 130, and connects the wiring 195 to the metal layer E1 or E2. Note that the vias V4 and V5 according to the present embodiment are only required to connect the wirings 194 and 195 to the metal layer E1 or E2 in the base 130, and the positions thereof on the base 130 are not limited to those illustrated in FIG. 7.

Other configurations and effects of the resonator 10 according to the present embodiment are the same as those of the first embodiment.

Third Exemplary Embodiment

Figure 8:
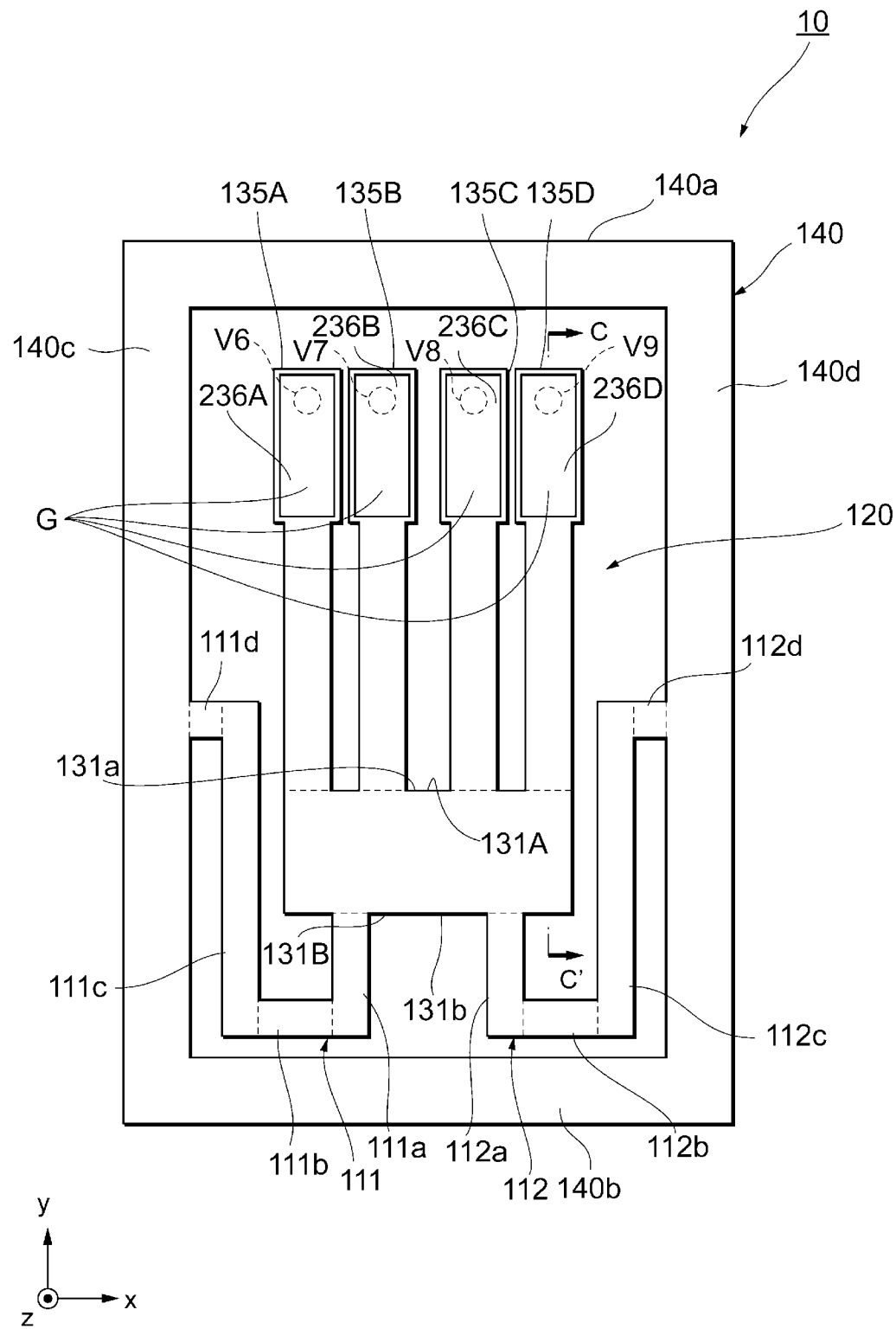
FIG. 8 is a plan view of a resonator according to a third exemplary embodiment.

FIG. 8 is a plan view schematically illustrating an example of the structure of a resonator 10 according to the present embodiment. Hereinafter, among the detailed configurations of the resonator 10 according to the present embodiment, different points from the first embodiment will be mainly described. The resonator 10 according to the present embodiment does not include, among the configurations described in the first embodiment, the wirings 191, 192, and 193, and includes vias V6, V7, V8, and V9 in place of the vias V1, V2, and V3.

In this embodiment, the vias V6, V7, V8, and V9 are formed at tip ends of vibration arms 135A, 135B, 135C, and 135D, respectively, and connect frequency adjusting films 236A, 236B, 236C, and 236D to a metal layer E2.

Figure 9:
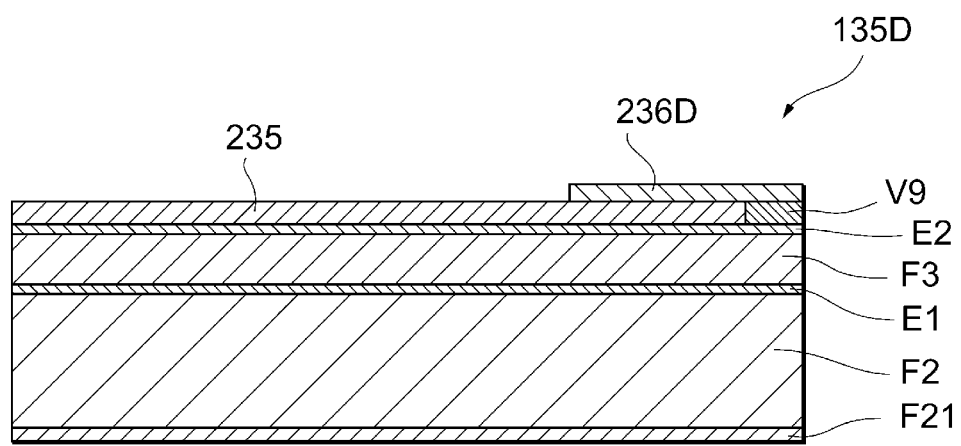
FIG. 9 is a cross-sectional view that is taken along a line C-C' in FIG. 8, and schematically illustrates a mode in which wiring is connected to an upper metal layer.
Figure 9:
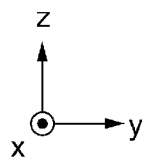

Next, with reference to FIG. 9, a connection mode of the frequency adjusting film 236 and the metal layer E2 in the resonator 10 according to the present embodiment will be described while taking a case of the frequency adjusting film 236D as an example. FIG. 9 is a general view schematically illustrating a cross section taken along a line C-C' in FIG. 8.

As illustrated in FIG. 9, the via V9 according to the present embodiment is formed in the following manner: a hole is formed by removing part of the protective film 235 at the tip end of the vibration arm 135D so that the metal layer E2 is exposed, and then the above-formed hole is filled with a conductor. Other connection modes are the same as those of the first embodiment.

In the resonator 10 according to the present embodiment, since the frequency adjusting film 236 is connected to the metal layer E2, a process of forming wiring on the resonator 10 can be omitted. Other configurations and effects of the resonator 10 are the same as those of the first embodiment.

Fourth Exemplary Embodiment

Figure 10:
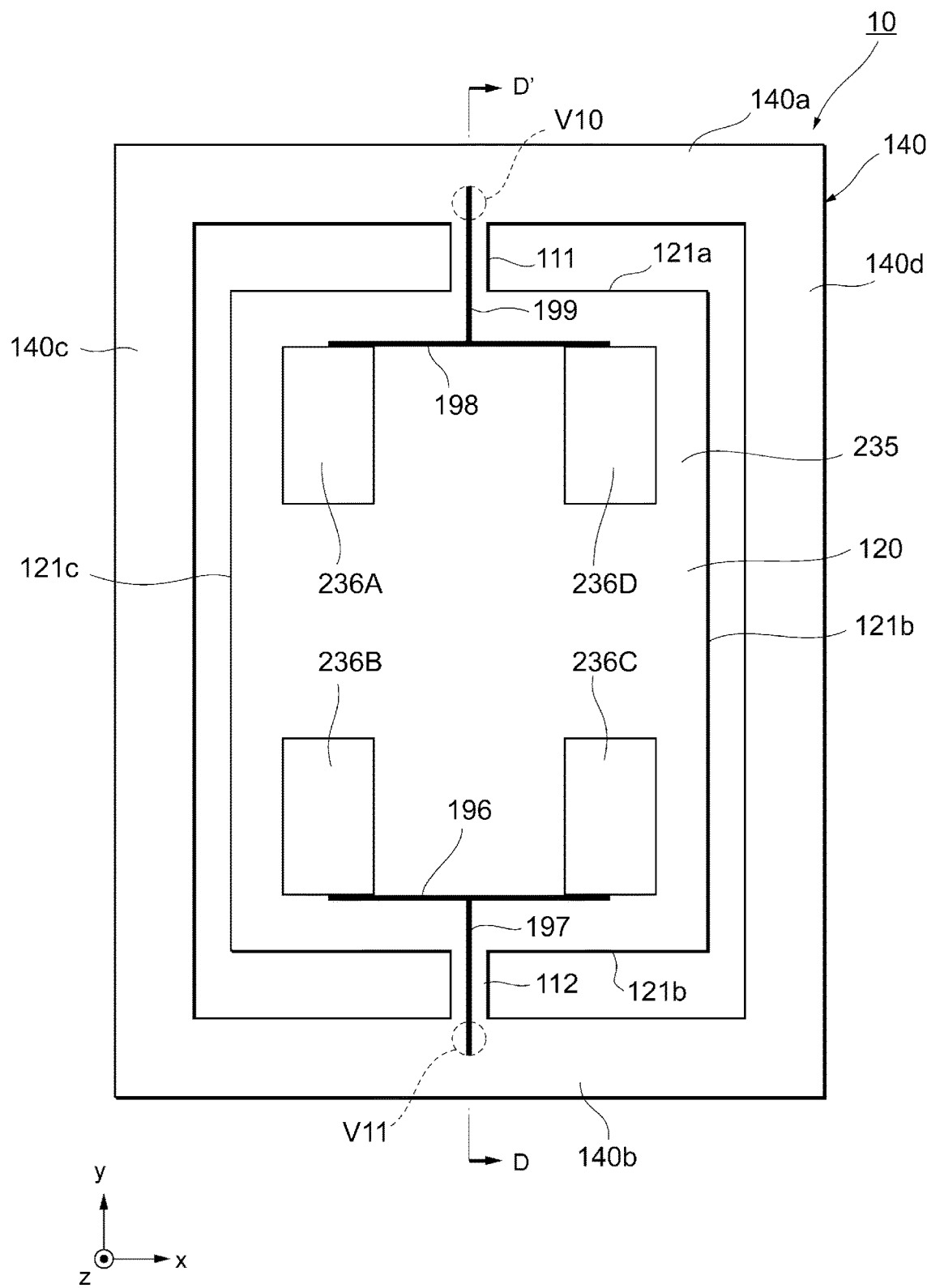
FIG. 10 is a plan view of a resonator according to a fourth exemplary embodiment.

FIG. 10 is a diagram illustrating an example of a plan view of a resonator 10 according to the present embodiment. Hereinafter, among the detailed configurations of a resonance device 1 according to the present embodiment, difference points from the first embodiment will be mainly described.

In this embodiment, the resonator 10 is an in-plane vibrator configured to perform contour vibration within a plane of the X-Y plane. In this embodiment, the resonator 10 includes wirings 196, 197, 198, and 199 and vias V10 and V11 in place of the wirings 191, 192, and 193 and the vias V1, V2, and V3 described in the first embodiment. Further, a vibration section 120 and holding arms 111 and 112 according to the present embodiment have different configurations from those of the first embodiment.

Vibration Section 120

The vibration section 120 has a substantially rectangular parallelepiped contour extending in a flat plate shape along an X-Y plane in the orthogonal coordinate system in FIG. 10. Further, the vibration section 120 has short sides 121a and 121b in the X-axis direction and long sides 121c and 121d in the Y-axis direction. The vibration section 120 is connected to a holding section 140 by the holding arms 111 and 112 at the short sides 121a and 121b, thereby being held. A protective film 235 is so formed as to cover the entire surface of the vibration section 120. Further, on a surface of the protective film 235, four frequency adjusting films 236A to 236D are laminated in four corners of the vibration section 120 (which are an example of a second region).

Other configurations of the vibration section 120 are similar to those of the first embodiment. The number of frequency adjusting films is not limited to four, and the number thereof may be two in which the frequency adjusting films 236A and 236B are joined and the frequency adjusting films 236C and 236D are joined, for example. However, it is desirable that the frequency adjusting film includes a second region giving large displacement during the vibrations, and that the second region is equal to or smaller in size than the area of a first region. As a result, it is possible to efficiently perform frequency adjustment and to suppress a change in frequency temperature characteristics due to the frequency adjustment.

(2) Holding Arms 111, 112

In this embodiment, each of the holding arms 111 and 112 is formed in a substantially rectangular shape having a long side in the Y-axis direction and a short side in the X-axis direction.

One end of the holding arm 111 is connected to the vicinity of the center of the short side 121a in the vibration section 120, from which the holding arm 111 extends substantially perpendicularly along the Y-axis direction. Further, the other end of the holding arm 111 is connected to the vicinity of the center of a frame body 140a in the holding section 140.

On the other hand, one end of the holding arm 112 is connected to the vicinity of the center of the short side 121b of the vibration section 120, from which the holding arm 112 extends substantially perpendicularly along the Y-axis direction. Further, the other end of the holding arm 112 is connected to the vicinity of the center of a frame body 140b in the holding section 140.

Other configurations and functions of the holding arms 111 and 112 are the same as those of the first embodiment.

(3) Wirings 196 197, 198, 199

In this embodiment, the wiring 198 and wiring 199 connect the frequency adjusting films 236A and 236D to the via V10, while the wiring 196 and wiring 197 connect the frequency adjusting films 236B and 236C to the via V11.

The wiring 198 is formed in an end portion on the frame body 140a side of the vibration section 120, and connects end portions on the frame body 140a side of the frequency adjusting films 236A and 236D to each other. The wiring 199 is connected to the vicinity of the center of the wiring 198, is formed extending therefrom to the holding arm 111 and the frame body 140a, and is connected to the via V10.

On the other hand, the wiring 196 is formed in an end portion on the frame body 140b side of the vibration section 120, and connects end portions on the frame body 140b side of the frequency adjusting films 236B and 236C to each other. The wiring 197 is connected to the vicinity of the center of the wiring 196, is formed extending therefrom to the holding arm 112 and the frame body 140b, and is connected to the via V11.

Other configurations of the wirings 196, 197, 198, and 199 are the same as those of the wiring 191 in the first embodiment.

(4) Vias V10, V11

In this embodiment, the vias V10 and V11 electrically connect the frequency adjusting film 236 to a metal layer E1 or E2 via the wirings 198 and 199, and the wirings 196 and 197, respectively. Other configurations of the vias V10 and V11 are the same as those of the via V1 in the first embodiment.

(5. Connection Mode)

Figure 11:
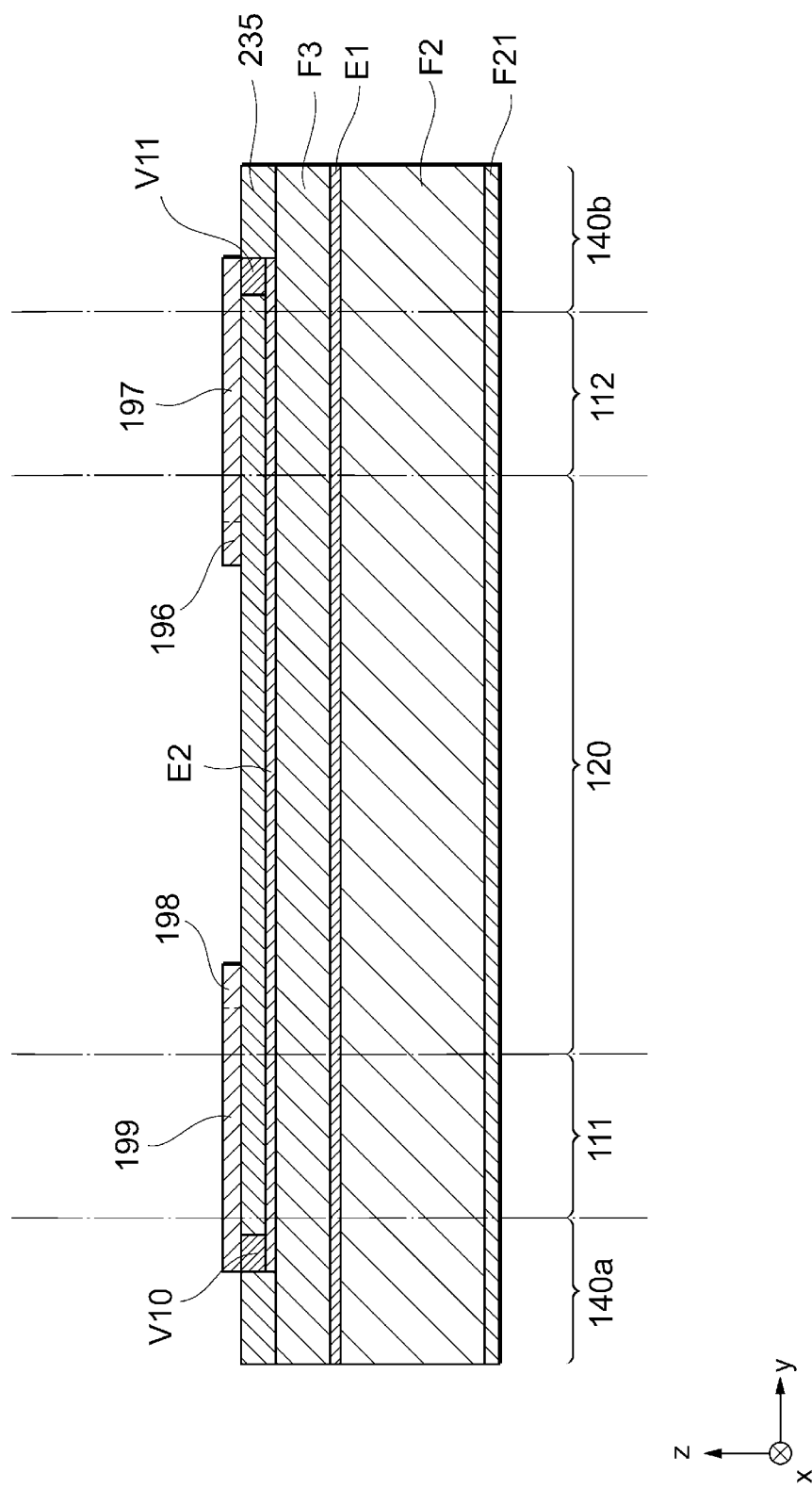
FIG. 11 is a cross-sectional view that is taken along a line D-D' in FIG. 10, and schematically illustrates a mode in which wiring is connected to an upper metal layer.

With reference to FIGS. 11 and 12, a connection mode of the frequency adjusting film 236 and the metal layer in the resonator 10 according to the present embodiment will be described. Each of FIGS. 11 and 12 is a general view schematically illustrating a cross section taken along a line D-D' in FIG. 10. FIG. 11 exemplifies a case in which the wiring 197 and wiring 199 are connected to the metal layer E2, and FIG. 12 exemplifies a case in which the wiring 199 and wiring 197 are connected to the metal layer E1.

As illustrated in FIG. 11, the wiring 199 and wiring 197 are connected to the metal layer E2 via the vias V10 and V11, respectively, on the holding section 140. Further, as illustrated in FIG. 12, the wiring 199 and wiring 197 may be configured to be connected to the metal layer E1 via the vias V10 and V11, respectively, on the holding section 140.

Although, in this embodiment, the resonance device 1 is configured to include the resonator 10 as an in-plane vibrator that performs contour vibration in a fundamental wave mode, the present invention is not limited thereto. For example, the resonance device 1 may be configured such that a plurality of resonators is integrated to vibrate in a higher-order mode.

Other configurations and functions of the resonance device 1 are the same as those of the first embodiment.

As set forth above, exemplary embodiments of the have been described in which a resonator 10 is provide according to an exemplary embodiment that includes a metal layer E2 and a metal layer E1; a piezoelectric thin film F3 that is provided between the metal layer E2 and the metal layer E1, has an upper surface opposing the metal layer E2, and vibrates in a predetermined vibration mode when a voltage is applied between the metal layer E2 and the metal layer E1; a protective film 235 made of an insulator and provided opposing the upper surface of the piezoelectric thin film F3 with the metal layer E2 interposed therebetween; and a frequency adjusting film 236 made of a conductor and provided opposing the upper surface of the piezoelectric thin film F3 with the protective film 235 interposed therebetween, wherein the frequency adjusting film 236 is electrically connected to any one of the metal layer E2 and the metal layer E1. In the resonator 10 according to the present embodiment, since it is possible to suppress an electric charge which is charged on the protective film 235 formed on the vibration section 120, it is possible to prevent a variation in the resonant frequency due to the electric charge on the vibration section 120.

In addition, it is also preferable that the surface of the piezoelectric thin film F3 include a first region and a second region giving a larger displacement than the first region at a time of vibration, and that the frequency adjusting film 236 be so provided as to oppose the upper surface of the piezoelectric thin film F3 with the protective film 235 interposed therebetween in at least part of the second region. Thus, by adjusting the film thickness of the frequency adjusting film 236, it is possible to suppress the frequency variation among the plurality of resonance devices 1 produced on the same wafer.

Further, it is also preferable that the protective film 235 be made of a piezoelectric material and a thickness thereof along the C-axis direction be equal to or smaller than half of a thickness of the piezoelectric thin film F3. In this case, since the frequency adjusting film 236 and the metal layer E2 sandwiching the protective film 235 therebetween are short-circuited, it is possible to suppress a situation in which the vibration is obstructed by the protective film 235 made of the piezoelectric material.

Further, it is preferable for the protective film 235 to be a piezoelectric material that is oriented in the same direction as the piezoelectric thin film F3. With this, in the case where the frequency adjusting film 236 is connected to the metal layer E2, it is also possible to suppress a situation in which the vibration of the vibration section 120 is obstructed.

Further, it is preferable for the resonator 10 to be an out-of-plane bending vibrator.

Further, the resonance device 1 according to the present embodiment includes the above-described resonator 10, the upper lid 30 and the lower lid 20 provided opposing each other sandwiching the resonator 10, and an outer electrode. In the resonance device 1 according to the present embodiment, since it is possible to suppress the electric charge which is charged on the protective film 235 formed on the vibration section 120, it is possible to prevent the variation in the resonant frequency due to the electric charge on the vibration section 120.

It is noted that each of the exemplary embodiments described above is given for facilitating the understanding of the present invention and is not intended to limit the interpretation of the present invention. The present invention can be modified/improved without departing from the spirit and scope of the invention, and equivalents thereof are also included in the present invention. In other words, in a case that those skilled in the art perform design change on the above-discussed embodiments as desired, those achieved by the design change are also encompassed within the scope of the present invention as long as they include the features of the present invention. For example, the constituent elements, arrangement thereof, materials, conditions, shapes, sizes, and the like included in the above embodiments are not limited to those having been exemplified, and can be appropriately changed. For example, in the above-described embodiments, although the case in which a multilayer body constituted of the metal layer E2 and the piezoelectric thin film F3 has a single-layer structure is described, the invention is not limited thereto. The structure of the resonator 10 may be such that the multilayer body constituted of the metal layer E2 and the piezoelectric thin film F3 includes multiple layers, and the protective film 235 is formed on a surface of the uppermost layer (on the upper lid 30 side). It is needless to say that each of the above embodiments is illustrative and configurations described in the different embodiments can be partially replaced or combined with each other, and those achieved by doing so are also encompassed within the scope of the present invention as long as they include the features of the present invention.

REFERENCE SIGNS LIST

1 RESONANCE DEVICE
10 RESONATOR
30 UPPER LID
20 LOWER LID
140 HOLDING SECTION
140a-140d FRAME BODY
111, 112 HOLDING ARM
120 VIBRATION SECTION
130 BASE
135A-135D VIBRATION ARM
F2 Si SUBSTRATE
F21 SILICON OXIDE LAYER (TEMPERATURE CHARACTERISTICS CORRECTION LAYER)
191-199 WIRING
V1-V11 VIA
235 PROTECTIVE FILM
236 FREQUENCY ADJUSTING FILM

The invention claimed is:

1. A resonator comprising:
a first electrode and a second electrode;
a piezoelectric film disposed between the first and second electrodes, the piezoelectric film having an upper surface that opposes the first electrode;
a protective film comprising an insulator and disposed opposing the upper surface of the piezoelectric film with the first electrode interposed between the protective film and the upper surface of the piezoelectric film; and
a conductive film disposed opposing the upper surface of the piezoelectric film with the protective film interposed between the conductive film and the upper surface of the piezoelectric film,
wherein the conductive film is electrically connected to at least one of the first electrode and the second electrode,
wherein the upper surface of the piezoelectric film includes a first region and a second region configured to provide a larger displacement than the first region during vibration of the piezoelectric film, and
wherein the conductive film is disposed to oppose the upper surface of the piezoelectric film with the protective film interposed between the conductive film and the upper surface of the piezoelectric film in at least a portion of the second region.

2. The resonator according to claim 1, wherein the piezoelectric film is configured to vibrate in a predetermined vibration mode when a voltage is applied between the first and second electrodes.

3. The resonator according to claim 1, wherein the conductive film is a frequency adjusting film configured to adjust a resonant frequency of the resonator.

4. The resonator according to claim 1, wherein the protective film comprises a piezoelectric material having thickness extending in a C-axis direction that is equal to or smaller than half of a thickness of the piezoelectric film.

5. The resonator according to claim 1, wherein the protective film comprises a piezoelectric material oriented in a same direction as the piezoelectric film.

6. The resonator according to claim 1, further comprising:
a vibrating component comprising a base and a plurality of vibrating arms extending therefrom;
a frame at least partially surrounding the vibrating component; and
at least one holding arm connecting the frame to the base of the vibrating component.

7. The resonator according to claim 6, wherein the frame comprises at least one via extending through the protective film and configured to electrically connect the conductive film to the at least one of the first electrode and the second electrode.

8. The resonator according to claim 7, further comprising a wiring extracted from the conductive film and extending from at least one of the plurality of vibration arms to the at least one via of the frame over the base and the at least one holding arm, such that the wiring is electrically connected to the at least one of the first electrode and the second electrode.

9. The resonator according to claim 6, wherein the frame comprises a plurality of vias that each extend through the protective film, with a first via of the plurality of vias electrically connecting the conductive film to the first and a second via of the plurality of vias electrically connecting the conductive film to the second electrode.

10. The resonator according to claim 9, further comprising:
first and second wiring extracted from the conductive film,
wherein the first wiring extends from a first vibration arm of the plurality of vibration arms to the first via and is electrically connected to the first electrode by the first via, and
wherein the second wiring extends from a second vibration arm of the plurality of vibration arms to the second via and is electrically connected to the second electrode by the second via.

11. The resonator according to claim 10, wherein the first and second vibration arms of the plurality of vibration arms are configured to vibrate in an opposite direction from each other when a voltage is applied to the first and second electrodes.

12. The resonator according to claim 1, further comprising at least one via extending through the protective film and configured to electrically connect the conductive film to the at least one of the first electrode and the second electrode.

13. A resonator comprising:
a first electrode and a second electrode;
a piezoelectric film disposed between the first and second electrodes, the piezoelectric film having an upper surface that opposes the first electrode;
a protective film comprising an insulator and disposed opposing the upper surface of the piezoelectric film with the first electrode interposed between the protective film and the upper surface of the piezoelectric film;
a conductive film disposed opposing the upper surface of the piezoelectric film with the protective film interposed between the conductive film and the upper surface of the piezoelectric film; and
a plurality of vibration arms extending from a base thereof,
wherein the resonator is configured to vibrate in an out-of-plane bending vibration mode with at least one of the plurality of vibration arms configured to vibrate in an opposite direction from a second of the plurality of vibration arms, and
wherein the conductive film is electrically connected to at least one of the first electrode and the second electrode.

14. The resonator according to claim 13, further comprising at least one via extending through the protective film and configured to electrically connect the conductive film to the at least one of the first electrode and the second electrode.

15. A resonator comprising:
a first electrode;
a piezoelectric film disposed on the first electrode;
a second electrode disposed on the piezoelectric film;
a protective film comprising an insulator and disposed opposing the second electrode; and
a conductive film disposed on the piezoelectric film and electrically connected to at least one of the first electrode and the second electrode;
wherein the resonator further includes:
a vibrating component comprising a base and a plurality of vibrating arms extending therefrom;
a frame at least partially surrounding the vibrating component and
at least one holding arm connecting the frame to the base of the vibrating component,
wherein the frame comprises at least one via extending through the protective film and configured to electrically connect the conductive film to the at least one of the first electrode and the second electrode.

16. The resonator according to claim 15, wherein the conductive film is a frequency adjusting film configured to adjust a resonant frequency of the resonator.

17. The resonator according to claim 15,
wherein an upper surface of the piezoelectric film opposite the first electrode includes a first region and a second region configured to provide a larger displacement than the first region during vibration of the piezoelectric film, and
wherein the conductive film is disposed opposing the upper surface of the piezoelectric film with the protective film interposed between the conductive film and the upper surface of the piezoelectric film in at least a portion of the second region.

18. The resonator according to claim 15, wherein the protective film comprises a piezoelectric material having thickness extending in a C-axis direction that is equal to or smaller than half of a thickness of the piezoelectric film.

19. The resonator according to claim 15, further comprising a wiring extracted from the conductive film and extending from at least one of the plurality of vibration arms to the at least one via of the frame over the base and the at least one holding arm, such that the wiring is electrically connected to the at least one of the first electrode and the second electrode.

20. The resonator according to claim 15, wherein the frame comprises a plurality of vias that each extend through the protective film, with a first via of the plurality of vias electrically connecting the conductive film to the first and a second via of the plurality of vias electrically connecting the conductive film to the second electrode.

\* \* \* \* \*